United States Patent
Peh et al.

(10) Patent No.: US 10,784,134 B2
(45) Date of Patent: Sep. 22, 2020

(54) IMAGE BASED SUBSTRATE MAPPER

(71) Applicant: APPLIED MATERIALS, INC., Santa Clara, CA (US)

(72) Inventors: Eng Sheng Peh, Singapore (SG);
Karthik Balakrishnan, Chennai (IN);
Sriskantharajah Thirunavukarasu,
Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 153 days.

(21) Appl. No.: 15/958,327

(22) Filed: Apr. 20, 2018

(65) Prior Publication Data

US 2018/0323095 A1 Nov. 8, 2018

Related U.S. Application Data

(60) Provisional application No. 62/500,873, filed on May 3, 2017.

(51) Int. Cl.
| | | |
|---|---|---|
| *H01L 21/67* | (2006.01) | |
| *G06T 7/00* | (2017.01) | |
| *H01L 21/677* | (2006.01) | |
| *H01L 21/68* | (2006.01) | |

(52) U.S. Cl.
CPC ...... *H01L 21/67288* (2013.01); *G06T 7/0004* (2013.01); *H01L 21/6773* (2013.01); *H01L 21/67155* (2013.01); *H01L 21/67265* (2013.01); *H01L 21/681* (2013.01); *G06T 2207/30148* (2013.01)

(58) Field of Classification Search
CPC ......... H04L 21/67288; H04L 21/67155; H04L 21/67265; H04L 21/6773; H04L 21/681; G06T 7/0004; G06T 2207/30148
See application file for complete search history.

(56) References Cited

U.S. PATENT DOCUMENTS

| | | | |
|---|---|---|---|
| 6,222,624 B1 * | 4/2001 | Yonezawa | G01N 21/95607 356/237.1 |
| 2007/0112465 A1 | 5/2007 | Sadighi et al. | |
| 2009/0225160 A1 * | 9/2009 | Shah | H01L 21/67353 348/94 |

(Continued)

FOREIGN PATENT DOCUMENTS

| | | |
|---|---|---|
| JP | 2010-186863 A | 8/2010 |
| KR | 10-2011-0089645 A | 8/2011 |
| KR | 10-2012-0112165 A | 10/2012 |

OTHER PUBLICATIONS

International Search Report and Written Opinion dated Aug. 9, 2018 for PCT Application No. PCT/US2018/028825.

*Primary Examiner* — Leon Viet Q Nguyen
(74) *Attorney, Agent, or Firm* — Moser Taboada

(57) ABSTRACT

Methods and apparatus for detecting warpage in a substrate are provided herein. In some embodiments, a warpage detector for detecting warpage in substrates includes: one or more light sources to illuminate one or more substrates when present; a camera for capturing images of exposed portions of one or more substrates when present; a motion assembly having a mounting stage for supporting the camera; and a data acquisition interface (DAI) coupled to the camera to process substrate images and detect warpage of substrates based upon the processed substrate images.

18 Claims, 4 Drawing Sheets

(56) References Cited

U.S. PATENT DOCUMENTS

| | | | |
|---|---|---|---|
| 2011/0122327 A1* | 5/2011 | Kotani | F16M 11/40 |
| | | | 348/744 |
| 2012/0281875 A1* | 11/2012 | Yasuda | H01L 21/67265 |
| | | | 382/103 |
| 2015/0276616 A1 | 10/2015 | Horn | |
| 2017/0243738 A1* | 8/2017 | Noda | H01L 21/6715 |
| 2018/0068881 A1* | 3/2018 | Cavins | H01L 21/67727 |

* cited by examiner

IMAGE BASED SUBSTRATE MAPPER

CROSS-REFERENCE TO RELATED APPLICATIONS

This application claims benefit of U.S. provisional patent application Ser. No. 62/500,873, filed May 3, 2017, which is herein incorporated by reference in its entirety.

FIELD

Embodiments of the present disclosure generally relate to substrate manufacturing processes.

BACKGROUND

With the persisting need for better, smaller, faster, and more reliable electronics' goods, substrate manufacturers must produce good quality and reliable substrates at increasing processing speeds. Substrate manufacturing typically involves substrate mapping for detecting substrate absence, substrate misplacement, substrate cross-slotting, substrate double-slotting, and other similar substrate placement errors common in cassettes and Front Opening Unified Substrate storage cassettes (FOUPs).

Current substrate mapping technologies, such as optical mapping sensors, are typically provided as stand-alone devices or as part of edge (or vacuum) grip end-effectors. The current substrate mapping devices and methods are typically used to map substrates that may have varying coatings, edge geometries, and thicknesses. However, the inventors have discovered that the current substrate mapping devices and methods are poor in detecting substrate warpage and thus fail to sustain acceptable process yields.

Therefore, the inventors have provided improved apparatus and methods for timely and accurately detecting substrate warping.

SUMMARY

Methods and apparatus for detecting warpage in a substrate are provided herein. In some embodiments, a warpage detector for detecting warpage in substrates includes: one or more light sources to illuminate one or more substrates when present; a camera for capturing images of exposed portions of one or more substrates when present; a motion assembly having a mounting stage for supporting the camera; and a data acquisition interface (DAI) coupled to the camera to process substrate images and detect warpage of substrates based upon the processed substrate images.

In some embodiments, a substrate processing system includes: one or more process chambers; a transfer chamber; a pair of load lock chambers; a plurality of substrate storage cassettes having a front opening and configured to receive and hold a plurality of substrates; a substrate storage cassette loader to shuttle cassettes of substrates between the load lock chambers and the plurality of substrate storage cassettes; and a warpage detector for detecting warpage of substrates in the plurality of substrate storage cassette. The warpage detector may be as in any of the embodiments described herein.

In some embodiments, a method for detecting warpage in a substrate for processing includes: (a) capturing an image of an edge of the substrate; (b) processing the image of the edge of the substrate; and (c) determining an extent of warpage in the substrate from the processed image.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
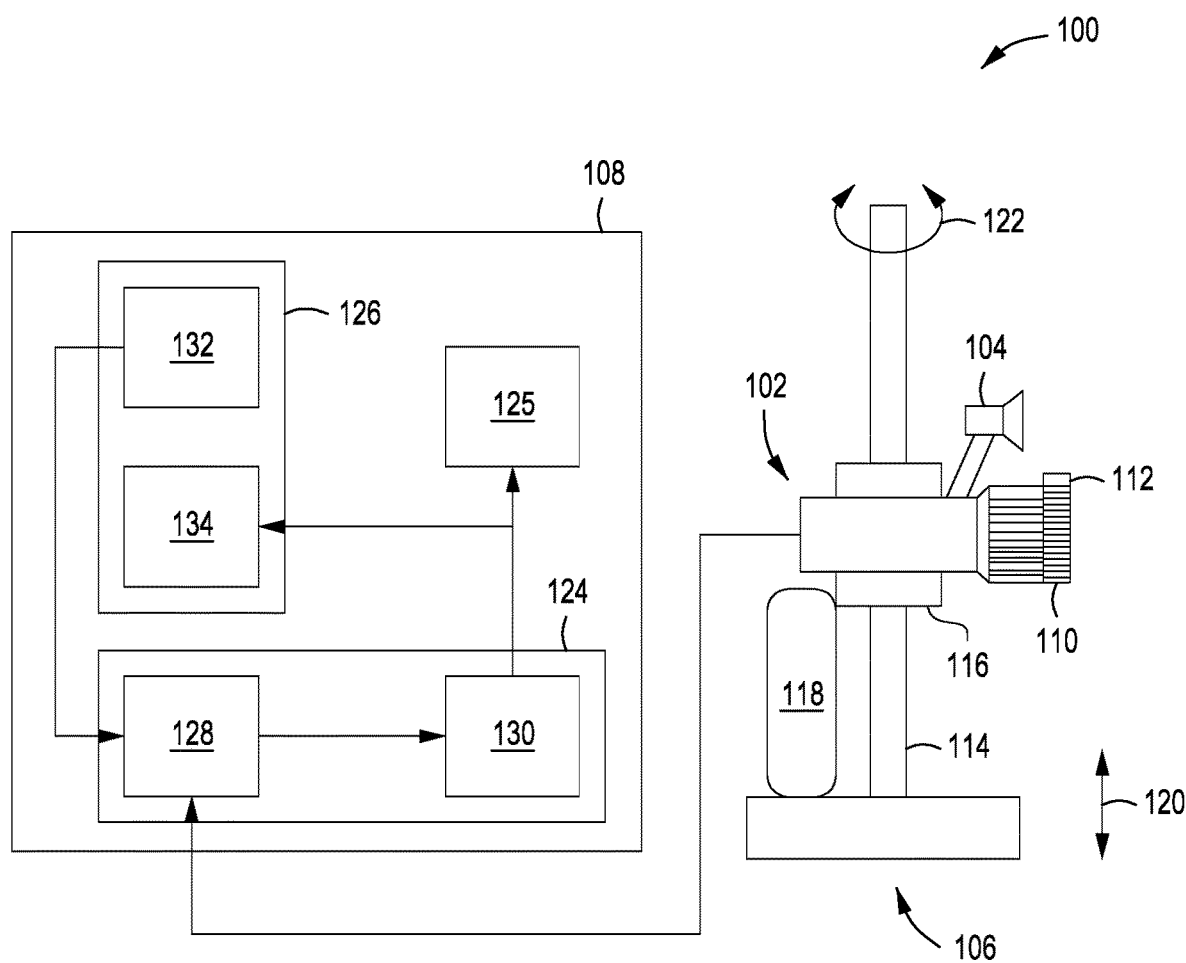
FIG. 1 is a schematic view of a warpage detector in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure include a system and method for detecting the warpage of substrates contained in substrate storage cassettes (e.g., FOUPs) prior to performing one or more processes on the substrates. The inventors have observed that current substrate mapping methods and apparatus are focused on mapping the planar principal surfaces of substrates (e.g., x-y plane of substrate) and fail to detect substrate warpage out of the x-y plane along the z axis. Such warpage may be due, for example, to deformities along the side edge of the substrate.

According to embodiments consistent with the present disclosure, a warpage detector is provided and used to measure and analyze the warpage of the substrate prior to performing one or more processes on the substrates. Accordingly, embodiments of the present disclosure improves substrate processing by saving processing time and materials that may be otherwise expended on unacceptably warped substrates.

FIG. 1 is a schematic view of a warpage detector 100 in accordance with one or more embodiments of the present disclosure. The warpage detector 100 includes a high resolution camera 102, one or more light sources 104, a motion assembly 106, and a data acquisition interface (DAI) 108.

The high resolution camera 102 generally includes a focus lens 110 and a viewfinder 112. The focus lens 110 is provided to resolve and capture side views of substrates having thicknesses between about 300 micrometers and about 3000 micrometers, or in some embodiments, between about 300 micrometers and about 800 micrometers. In some embodiments, the high resolution camera 102 may be configured to be advantageously smaller and lighter than the motion assembly 106 and components thereof. For example, the high resolution camera 102 may have a mass of less than about 300 grams.

The one or more light sources 104 are provided to illuminate a portion of one or more substrates (e.g., substrates 208, discussed below) to be photographed with the high resolution camera 102. The light sources 104 are configured to deliver diffuse light. For example, the light sources 104 may comprise light emitting diodes (LEDs) or the like. The light sources 104 are advantageously shaped to promote light diffusion. For example, the light sources 104 may be bar or ring shaped diffusive light bulbs. In some embodiments, the light sources 104 are disposed proximate the one or more substrates to be photographed (e.g., substrates 208, discussed below). In some embodiments, the light sources 104 are disposed proximate the high resolution camera 102. For example, as depicted in FIG. 1, the light sources 104 may be disposed above the viewfinder 112.

The motion assembly 106 includes a vertical support 114, a mounting stage 116, and an actuator 118. The vertical support 114 is a support and a pivot for the mounting stage 116. The mounting stage 116 is configured to hold and support the high resolution camera 102 both when the resolution camera is in operation and when the mounting stage 116 moves the mounting stage 116 in one or more directions. The actuator 118 provides vertical motion to the mounting stage 116, up and down the vertical support, as represented by directional arrow 120. The actuator further provides laterally rotational motion to the mounting stage, as represented by the directional arrow 122.

The data acquisition interface (DAI) 108 is communicatively coupled to the high resolution camera 102. The DAI 108 includes an image processor 124, a data storage device 125, and a user interface 126. The image processor 124 contains at least an image processing algorithm 128 and an image data analyzer 130. The user interface 126 includes a user input shell 132 and an output reader 134.

Upon execution, the image processing algorithm 128 processes substrate images captured with the high resolution camera 102 by converting the substrate images into image data that can be interpreted by the image data analyzer 130. For example, the image processing algorithm 128 may convert a substrate image into pixels of binary data. For example, the image data may be in matrix or table form. In some embodiments, the image processing algorithm 128 may further include photograph improvement processes such as image noise filtering, or the like.

The image data analyzer 130 performs an analysis of the image data produced by the image processing algorithm 128 by comparing the image data to a warpage threshold standard. The warpage threshold standard includes lower and upper bound warpage values defined for a dimension of the photographed portion of the substrate (e.g., side photograph of substrate). In some embodiments, the warpage threshold standard may be input into the user input shell 132 by a user prior to beginning the mapping processes. In some embodiments, the warpage threshold standard may be pre-programmed as part of a recipe of the image processor. The warpage threshold standard is selected based on factors such as the tolerance of substrate inlets of processing chambers, and the application in which the substrates would be used.

Figure 2:
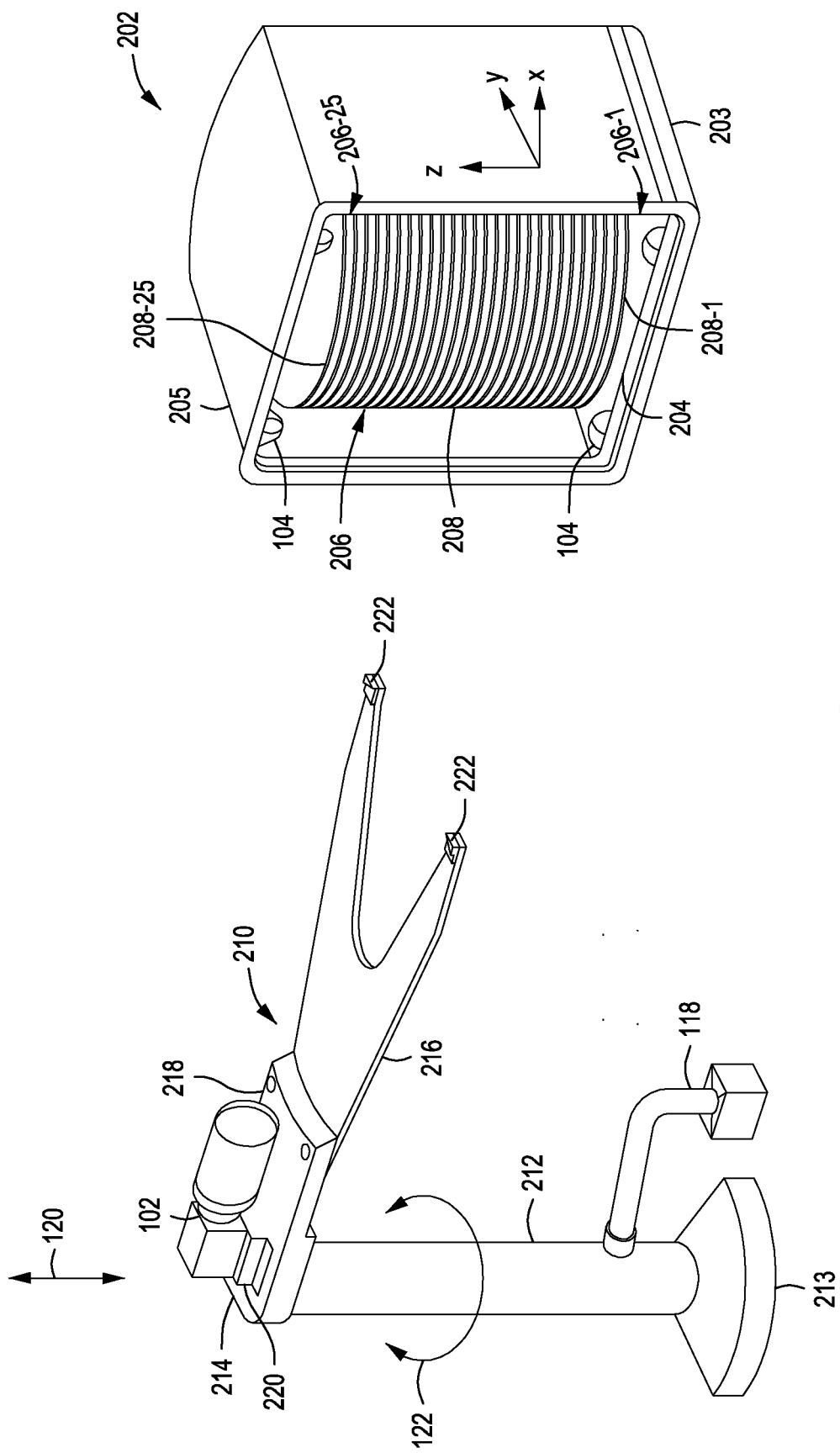
FIG. 2 depicts a schematic view of an exemplary warpage detector in relation to a substrate storage cassette in accordance with one or more embodiments of the present disclosure.

FIG. 2 shows the exemplary warpage detector 100 in relation to a substrate storage cassette 202 in accordance with one or more embodiments of the present disclosure.

The substrate storage cassette 202 (e.g., FOUP) has a bottom 203, a front opening 204, and a top 205. The substrate storage cassette 202 further comprises an array of spaced apart slots 206. Each slot 206 is configured to receive and support a substrate 208. As illustrated in the exemplary embodiment of FIG. 2, a total of N vertically arranged slots 206 may be labeled as slots 206-1 to 206-N, from the bottom 203 to the top 205, and configured to support substrates 208, respectively labeled as substrates 208-1 to substrate 208-N, from the bottom 203 to the top 205. In the exemplary embodiment shown in FIG. 2, the substrate storage cassette 202 has N=25, vertically arranged slots 206 and stacked substrates 208.

As illustrated by the x-y-z coordinate schematic shown on the side of the substrate storage cassette 202, the edges of the substrates 208 exposed through the front opening 204 advantageously facilitates photography and analysis of the z-direction deformation, if any, for warpage detection. As discussed above, the light sources 104 are disposed in an area suitable to illuminate one or more substrates to be photographed by the high resolution camera. As shown in FIG. 2, the light sources 104 are disposed in along the front opening 204, proximate the bottom 203 and proximate the top 205, to illuminate the exposed edges of the substrates 208.

Alternatively, or in combination with the actuator 118, the motion assembly 106 may include a robotic arm. FIG. 2 depicts an exemplary robotic arm 210. As depicted in FIG. 2, the robotic arm 210 extends from a central pivot 212. The central pivot includes a base 213. In some embodiments, the central pivot 212 may be fixed to a sturdy support surface at height below the bottom 203 of the substrate storage cassette 202, for example, a table top or a floor. The robotic arm 210 includes a rear end 214 and a blade 216. The rear end 214 includes a mounting surface 218. A mounting fixture 220 supports the high resolution camera 102 atop the mounting surface 218. The mounting fixture 220 may be any suitable holder such as a bracket, or a clamp, or the like. The blade 216 can have an edge gripper 222 or other suitable mechanism to secure substrates thereto during transfer (e.g. during transfer of substrate 208 into and out of substrate storage cassette 202, discussed below). In some embodiments, edge gripper 222 may be a vacuum gripper. The robotic arm 210 is configured to have vertical motion, up and down the central pivot 212, as represented by directional arrow 120. The robotic arm 210 is further configured to rotate laterally about the central pivot 212 and through the x-y direction facing the front opening 204. For example, as depicted in FIG. 2, the robotic arm 210 is depicted rotated about 90 degrees clockwise from a neutral position where the camera faces a center of an exposed edge of a substrate 208.

As shown in FIG. 2, the actuator 118 is coupled to the central pivot 212 to provide motion to the robotic arm 210. In some embodiments, motion of the robotic arm 210 may include remotely controllable motion devices to allow vertical and rotational displacements of the robotic arm when the actuator is not provided.

In operation in accordance with the embodiment depicted in FIG. 2, the prior processing the substrates 208, the high resolution camera 102 is, for example, lowered to the bottom of the substrate storage cassette 202. Starting with the lowermost slot 206 (e.g. slot 206-1), the high resolution camera 102 performs a continuous substrate presence scan from the bottommost slot 206 (e.g. slot 206-1) to the topmost slot (e.g. slot 206-25). When the topmost slot (e.g. slot 206-25) has been scanned, the camera comes to a stop. The substrate presence scan is performed to verify if a substrate 208 is present in each slot 206. The high resolution camera 102 relays the findings of the substrate presence scan to the DAI 108. The substrate presence scan can also be performed in any other suitable order, such as top to bottom, or the like.

Subsequently and optionally, for example starting with a first slot—such as the topmost slot 206 (e.g. slot 206-25)—the high resolution camera 102 begins capturing images of the planar principal surfaces of the substrates 208 (e.g., x-y planes of substrates 208-25 to 208-1). The images may be obtained at an angle to the principal planar surface due to their location in the substrate carrier. The high resolution camera 102 comes to a stop after capturing the x-y plane image of the last substrate—such as the bottommost substrate (e.g. substrate 208-1). Images of the planar principal surfaces of the substrates 208 (e.g., x-y planes of substrates 208-25 to 208-1) are sent to the image processor 124 for substrate mapping. The output reader 134 displays and sends the x-y plane mapping results to the data storage device 125. Alternatively, images of planar principal surfaces of the substrates 208 may be obtained in a different location (e.g., prior to loading into the cassette) and may be obtained using a different camera, with the x-y plane mapping results transmitted to the data storage device 125.

Following mapping of the planar principal surfaces of each substrate 208 contained in the substrate storage cassette 202, the height of the high resolution camera 102 is readjusted so that the viewfinder 112 is level and pointed to the center of the front facing edge of a first substrate, such as the bottommost substrate 208 (e.g. substrate 208-1). In some embodiments, the user interface 126 prompts the operator to enter the warpage threshold standard parameters into user input shell 132. The warpage threshold standard parameters may also be provided at an earlier stage or automatically.

Subsequently, the high resolution camera 102 captures an image of the facing edge of the first substrate 208 (e.g. substrate 208-1). The high resolution camera 102 moves to next slot having a substrate 208 therein, and comes to a stop. The high resolution camera 102 stops at a height where the viewfinder 112 is level and pointed to a center of the front facing edge of a second substrate 208 to be photographed (e.g. substrate 208-2). Subsequently, the high resolution camera 102 captures an image of the edge of the second substrate 208 (e.g. substrate 208-2). Sequentially, the operation is performed for each substrate 208 contained in the substrate storage cassette 202 until an image of the front facing edge of the last substrate, such as the topmost substrate 208 (e.g. substrate 208-25), is captured. The high resolution camera 102 sends the images of all the substrates (e.g. substrates 208-1 to 208-25) present in the slots 206 (e.g. slots 206-1 to 206-25) to the image processor 124 for processing.

In the image processor 124, the image processing algorithm 128 processes and converts the substrate images into image data that is sent to the image data analyzer 130. The image data analyzer 130 compares the image data to a warpage threshold standard. Following the warpage analysis, the substrate warpage results are read out and/or displayed by the output reader 134 in one or more forms, and sent to and stored in the data storage device 125. For example, the output reader 134 may display a table notifying the user of acceptable (e.g., PASSED) and rejected (e.g., FAILED) substrates.

In some embodiments, the image processor 124 and image processing algorithm 128 are configured to provide two-dimensional mapping of the substrates 208. In some embodiments, the image processor 124 and image processing algorithm 128 are configured to provide three-dimensional mapping of the substrates 208. The two-dimensional or three-dimensional mapping data are stored in the data storage device 125 and may be used to reconstruct and display two-dimensional or three-dimensional figures of the substrates on the output reader 134.

Figure 3:
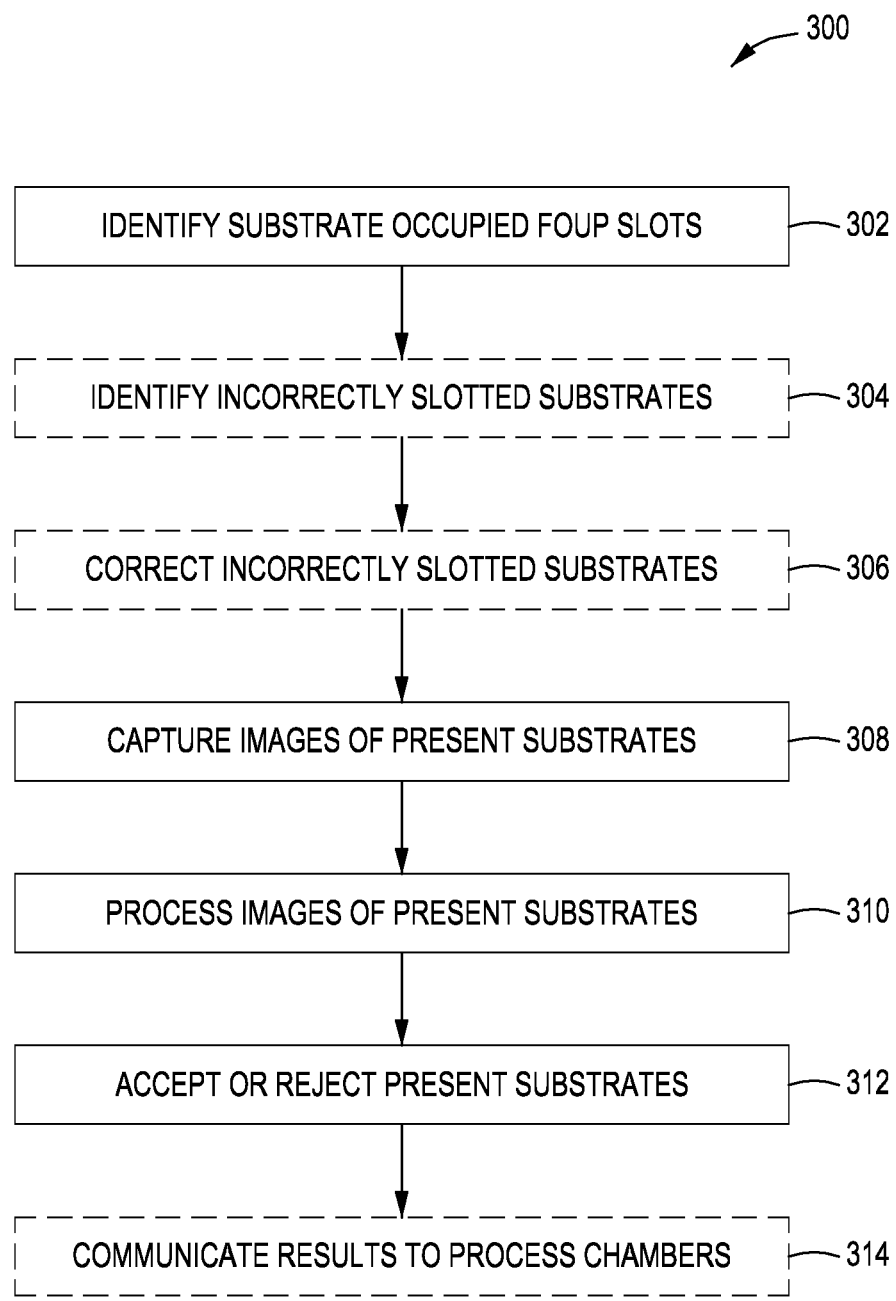
FIG. 3 depicts a method of detecting substrate warpage in accordance with some embodiments of the present disclosure.

FIG. 3 depicts a flow chart for a method 300 of detecting the warpage of substrates contained in substrate storage cassettes 202 in accordance with some embodiments of the present disclosure. The method 300 is described below with respect to FIG. 2. The method 300 may advantageously provide accurate and real-time detection of warpage of the substrates 208 disposed in substrate storage cassettes 202.

The method 300 begins at 302 by identifying slots 206 having a substrate 208 disposed therein. Optionally, as shown at 304, incorrectly slotted substrates 208 may be identified and subsequently corrected at 306. At 308, images of the exposed edges of substrates 208 in the slots 206 are captured. Optionally, in some embodiments, to improve the image quality, the edges of the substrates are illuminated with light, for example, diffusive light. At 310, the captured images of the substrates 308 are processed. At 312 image analysis is performed to detect and assess the amount of warpage of the substrates. Warped substrates are rejected and satisfactory substrates are accepted. At 314, the image analysis results are displayed and reported so that only the accepted substrates are processed in one or more processing chambers that may be provided in accordance with one or more embodiments of the present disclosure.

Method 300 may be performed on substrates disposed in substrate storage cassettes 202. The method 300 can be performed using standalone equipment, as discussed above with respect to FIGS. 1 and 2. Alternatively, the method 300 can be performed at the interface of one or more cluster tools, for example, a cluster tool 400 described below with respect to FIG. 4. In some embodiments, the method 300 may be performed on substrates disposed in substrate storage cassettes 202 provided at the interface of a standalone process chamber.

Examples of the cluster tool 400 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps.

Figure 4:
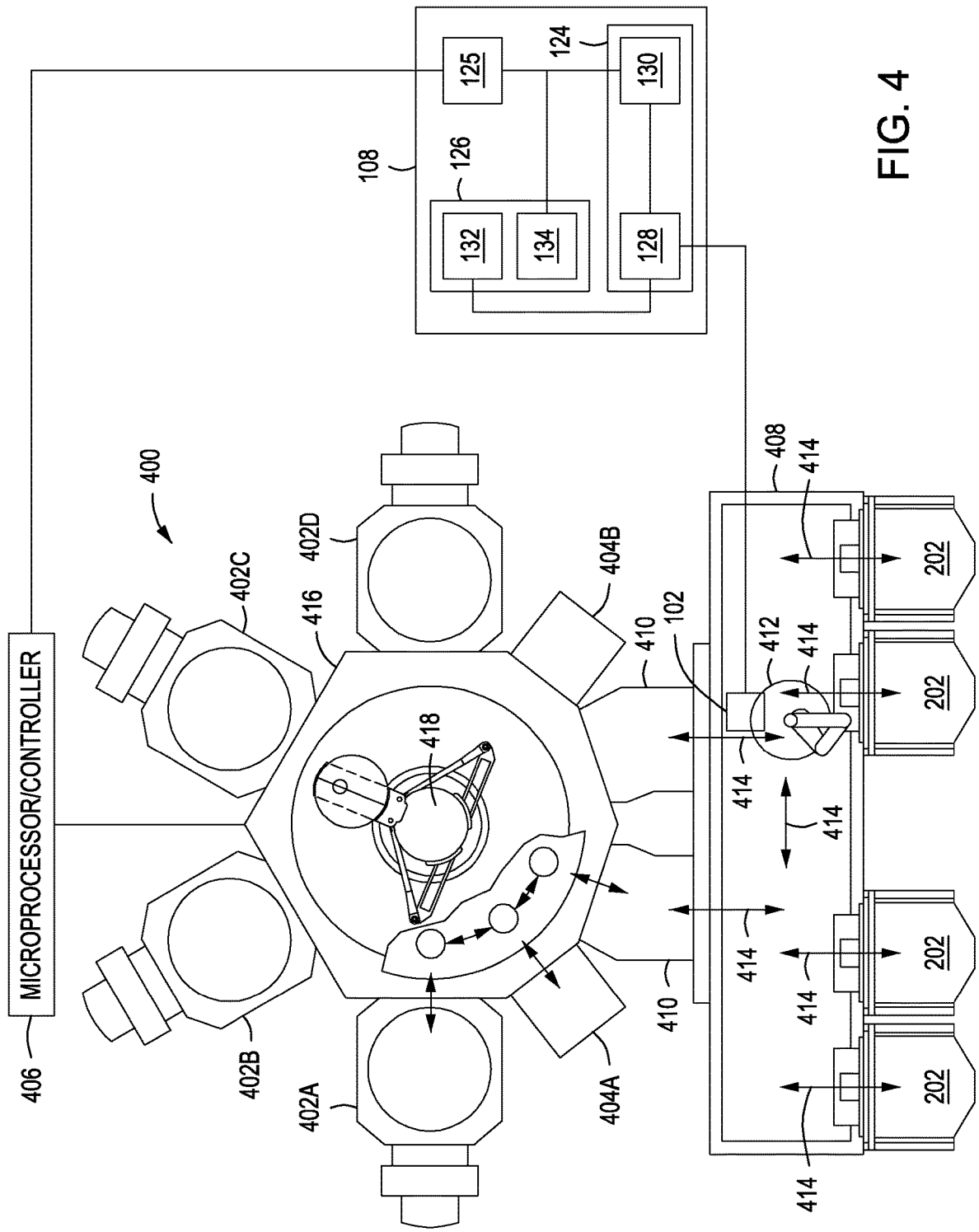
FIG. 4 depicts a cluster tool suitable to perform methods for processing substrates in accordance with some embodiments of the present disclosure.

FIG. 4 depicts a cluster tool suitable for performing portions of the present disclosure. Generally, the cluster tool is a modular system comprising multiple chambers (e.g., process chambers 402A-D, service chambers 404A-B, or the like) which perform various functions including substrate center-finding and orientation, degassing, annealing, deposition, and/or etching. According to embodiments of the present disclosure, the cluster tool may include chambers such as ion implantation chambers, etch chambers, and the like. The multiple chambers of the cluster tool are mounted to a central vacuum transfer chamber which houses a robot adapted to shuttle substrates between the chambers. The vacuum transfer chamber is typically maintained at a vacuum condition and provides an intermediate stage for shuttling substrates from one chamber to another and/or to a load lock chamber positioned at a front end of the cluster tool.

By way of illustration, a particular cluster tool 400 is shown in a plan view in FIG. 4. The cluster tool 400 generally comprises a plurality of chambers and robots and is equipped with a microprocessor controller 406 programmed to carry out the various processing methods performed in the cluster tool 400. A front-end environment 408 is shown positioned in selective communication with a pair of load lock chambers (load locks 410). A substrate storage cassette loader 412 disposed in the front-end environment 408 is capable of linear and rotational movement (arrows 414) to shuttle cassettes of substrates between the load locks 410 and a plurality of substrate storage cassettes 202 which are mounted on the front-end environment 408. The load locks 410 provide a first vacuum interface between the front-end environment 408 and a transfer chamber 416 (e.g., a vacuum transfer chamber). Two load locks 410 are provided to increase throughput by alternatively communicating with the transfer chamber 416 and the front-end environment 408. Thus, while one load lock 410 communicates with the transfer chamber 416, a second load lock 410 communicates with the front-end environment 408. A robot 418 is centrally disposed in the transfer chamber 416 to transfer substrates from the load locks 410 to the various processing chambers 402A-D and service chambers 404A-B. The processing chambers 402A-D may perform various processes such as physical vapor deposition, chemical vapor deposition, etching, cleaning, and the like, while the service chambers 404A-B may be adapted for degassing, orientation, cool down, and the like.

For the purposes of practicing embodiments of the present disclosure, the high resolution camera 102 of the warpage detector 100 is mounted on the substrate storage cassette loader 412 and the DAI 108 is communicatively coupled to the microprocessor controller 406.

Substrate warpage PASS/FAIL results send to the DAI 108 for storage in the data storage device 125 are further transmitted to the microprocessor controller 406. The microprocessor controller 406 instructs the storage cassette loader 412 to select only PASSING substrates, for processing in the various processing chambers 402A-D. Accordingly, resources are conserved and process quality is advantageously improved by detecting warped substrates prior to substrate processing.

While the foregoing is directed to embodiments of the present disclosure, other and further embodiments of the disclosure may be devised without departing from the basic scope thereof.

The invention claimed is:

1. A warpage detector for detecting warpage in substrates, the warpage detector comprising:
one or more light sources disposed in a front opening of a substrate storage cassette;
a camera for capturing images of exposed portions of one or more substrates when present;
a motion assembly having a mounting stage for supporting the camera; and
a data acquisition interface (DAI) coupled to the camera to process substrate images and detect warpage of substrates based upon the processed substrate images, wherein the camera includes a focus lens configured to resolve and capture an edge of a substrate having a thickness between about 300 micrometers and about 3000 micrometers.

2. The warpage detector of claim 1, wherein the mounting stage is coupled to a vertical support, wherein the mounting stage is configured to rotate laterally about the vertical support, and wherein the mounting stage is configured to move vertically along the vertical support.

3. The warpage detector of claim 1, wherein the one or more light sources are disposed above a viewfinder of the camera.

4. The warpage detector of claim 1, wherein the one or more light sources comprise diffusive light.

5. The warpage detector of claim 1, wherein the one or more light sources comprise light emitting diodes (LEDs).

6. The warpage detector of claim 1, wherein the camera has a mass of less than about 300 grams.

7. The warpage detector of claim 1, wherein the DAI further comprises a user input shell.

8. The warpage detector of claim 1, wherein the DAI further comprises a data storage device.

9. The warpage detector of claim 1, wherein the motion assembly further comprises a robotic arm.

10. A substrate processing system, comprising:
one or more process chambers;
a transfer chamber;
a pair of load lock chambers;
a plurality of substrate storage cassettes each having a front opening and configured to receive and hold a plurality of substrates;
a substrate storage cassette loader to shuttle cassettes of substrates between the pair of load lock chambers and the plurality of substrate storage cassettes; and
a warpage detector for detecting warpage of substrates in the plurality of substrate storage cassettes, the warpage detector comprising:
one or more light sources disposed in the front opening of each substrate storage cassette of the plurality of substrate storage cassettes to illuminate one or more substrates when present;
a camera for capturing images of exposed portions of one or more substrates when present, wherein the camera includes a focus lens configured to resolve and capture an edge of a substrate having a thickness between about 300 micrometers and about 3000 micrometers;
a motion assembly having a mounting stage for supporting the camera; and
a data acquisition interface (DAI) coupled to the camera to process substrate images and detect warpage of substrates based upon the processed substrate images.

11. The substrate processing system of claim 10, further comprising a microprocessor for providing communication between the DAI and the substrate storage cassette loader.

12. The substrate processing system of claim 10, wherein the substrate storage cassette loader comprises a robotic arm having a rear end disposed proximate a central pivot and a blade having an edge gripper or vacuum gripper for securing substrates during transfer.

13. The substrate processing system of claim 12, wherein the camera is mounted on the rear end.

14. A method for detecting warpage in a substrate for processing, comprising:
(a) capturing an image of an edge of the substrate having a thickness between about 300 micrometers and about 3000 micrometers;
(b) processing the image of the edge of the substrate;
(c) determining an extent of warpage in the substrate from the processed image; and
(d) communicating results including accepted substrates to one or more microprocessors so that only the accepted substrates are processed.

15. The method of claim 14, wherein during the capturing of the image of the edge of the substrate, the substrate is illuminated with diffusive light.

16. The method of claim 14, wherein the processing of the image of the edge of the substrate includes image noise filtering.

17. The method of claim 14, wherein determining the extent of warpage in the substrate comprises comparing image data of the substrate edge image to a warpage threshold standard.

18. The method of claim 14, wherein (a) to (c) are sequentially performed on a plurality of substrates contained in a substrate storage cassette.

* * * * *